US008568182B2

(12) United States Patent
Brug et al.

(10) Patent No.: US 8,568,182 B2
(45) Date of Patent: Oct. 29, 2013

(54) DISPLAY

(75) Inventors: James A. Brug, Menlo Park, CA (US); Lihua Zhao, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 679 days.

(21) Appl. No.: 12/891,414

(22) Filed: Sep. 27, 2010

(65) Prior Publication Data

US 2012/0075185 A1    Mar. 29, 2012

(51) Int. Cl.
  *H01J 9/00* (2006.01)
  *H01J 9/24* (2006.01)

(52) U.S. Cl.
  USPC ................................ 445/24; 445/46; 313/504

(58) Field of Classification Search
  USPC ................. 313/498–512; 445/24–25
  See application file for complete search history.

(56) References Cited

U.S. PATENT DOCUMENTS

| | | | |
|---|---|---|---|
| 6,169,686 B1 | 1/2001 | Brug et al. |
| 6,607,924 B2 | 8/2003 | Brug et al. |
| 6,677,174 B2 | 1/2004 | Kim et al. |
| 6,727,105 B1 | 4/2004 | Brug et al. |
| 6,835,953 B2 | 12/2004 | Cok et al. |
| 6,861,365 B2 | 3/2005 | Taussig et al. |
| 6,939,737 B2 | 9/2005 | Palanisamy |
| 6,965,361 B1 | 11/2005 | Sheats et al. |
| 7,115,983 B2 | 10/2006 | Wagner |
| 7,425,165 B2 | 9/2008 | Kim et al. |
| 7,476,557 B2 | 1/2009 | Daniels et al. |
| 7,764,013 B2 | 7/2010 | Lee et al. |
| 2010/0019222 A1 | 1/2010 | Yan et al. |
| 2010/0102300 A1 | 4/2010 | Burroughes et al. |

OTHER PUBLICATIONS

Chen, Yi-Chia, et al., "A Fluxless Bonding Technology Using Indium-Silver Multilayer Composites," IEEE Transactions on Components, Packaging, and Manufacturing Technology—Part A, vol. 20, No. 1, Mar. 1997, pp. 46-51.
Kim, Changsoon, et al., "Micropatterning of Organic Electronic Devices by Cold-Welding," Science Magazine, vol. 288, May 5, 2000, pp. 831-833.
Lauvernier, D., et al., "Metal Bonding with Ultra-thin Layer for Optical Applications," Proceedings Symposium IEEE/LEOS, Benelux Chapter, Brussels, 2007, pp. 79-82.
Indium Corporation, "Alloy Sorted by Temperature," Available at http://www.indium.com/products/alloy_sorted_by_temperature.pdf (Last accessed on Nov. 5, 2010).

*Primary Examiner* — Donald Raleigh

(57) ABSTRACT

A method of forming a display is provided, wherein the method includes forming a first electrode layer on a first substrate, forming an organic light emitting diode (OLED) stack on the first electrode, forming a second electrode layer over the OLED stack, and forming a bonding layer over the second electrode layer, wherein the bonding layer comprises a conductive material. The bonding layer and the second electrode layer are patterned to form a plurality of micro-OLEDs, wherein the patterning is performed by removing a portion of the bonding layer and the second electrode layer. The plurality of micro-OLEDs on the first substrate is joined to a plurality of pixels in an electronic backplane on a second substrate, wherein any one pixel in the electronic backplane can couple to a varied subset of micro-OLEDs in the plurality of micro-OLEDs.

20 Claims, 7 Drawing Sheets

100

300

400

500

800

DISPLAY

BACKGROUND

Organic light emitting diodes, or OLEDs, are organic structures that emit light in response to an applied current. OLEDs may be used to make intricately patterned displays. Such displays can be used in numerous devices, including cell phone screens and other small displays. However, challenges in fabrication may make the use of OLEDs in larger screens cost prohibitive.

BRIEF DESCRIPTION OF THE DRAWINGS

Certain exemplary embodiments are described in the following detailed description and in reference to the drawings, in which.

DETAILED DESCRIPTION OF SPECIFIC EMBODIMENTS

Current techniques for forming OLEDs often require very accurate alignment between OLED structures and backplane structures so that a particular pixel in the backplane energizes a target pixel. However, alignment of successive layers in OLED displays, for example, fabricated on plastic, can be problematic because of the variation in dimensions that result from the processing. This may be a greater issue for roll-to-roll fabrication where a rigid carrier is not used.

In embodiments, a method of integration is presented that does not require precise alignment. The technique is based on making a large number of similar, or even identical, functional units on a first substrate and a series of active cells on a second substrate. Lamination of the two substrates, with the functional cells facing the active cells forms the structure. Precise alignment is not needed, as the active cells will energize any of the functional units that they contact. Other functional units that are not in contact with any active cells are not energized and do not interfere with the functioning of the active cells.

Embodiments of the present techniques provide a method of bonding that may be used in this method of integration. One skilled in the art will recognize that the present techniques are not limited to OLEDs or even displays, but may be used in any electronics application in which alignment of functional units can be problematic. However, to simplify the explanation, an OLED application is detailed below.

Figure 1:
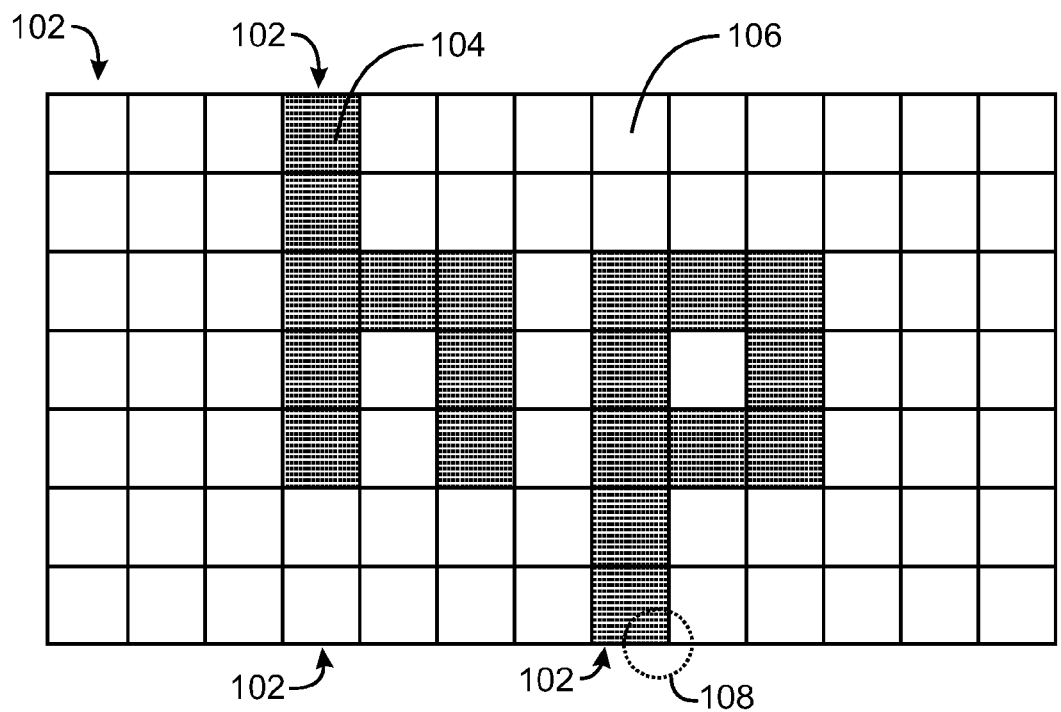
FIG. 1 is a drawing of an OLED display, in accordance with embodiments.

FIG. 1 is a drawing of an OLED display 100, in accordance with embodiments. The OLED display 100 may have a number of pixels 102 configured to emit light when energized. The OLED display 100 can display data by activating a first set of pixels 104 while leaving a second set of pixels 106 powered off. Although the pixels 102 shown in the exemplary OLED display 100 are relatively large in comparison to the data displayed, in other embodiments, the pixel size can be selected based on the application. Furthermore, display applications will generally use multiple pixels, each having a different color such as red, green, and blue, to generate color images.

Applications used for the display of image, video, or text data may have pixels 102 that are a smaller percentage of the total screen size to provide high resolutions. For example, in a large sign or stadium display of about 10 m in width the pixels 106 may be as large as 5 mm. If adjacent pixels are used to provide different colors for generating color images, then this can provide a horizontal resolution of about 667 for the display. In smaller displays, the pixels may be 500 µm, 250 µm, 100 µm, 10 µm, or even smaller. For example, in a display of about 30 cm in width, the pixels may be around 50 µm to provide an equivalent resolution of about 1900 pixels. Each pixel 102 may include numerous light emitting units, which can be termed micro-OLEDs. The micro-OLEDs are functional light emitting structures or cells that may be activated as a group by an active cell or pixel in an electronic backplane. This can be further seen by a close-up view of an area 108 of the OLED display discussed with respect to FIG. 2.

Figure 2:
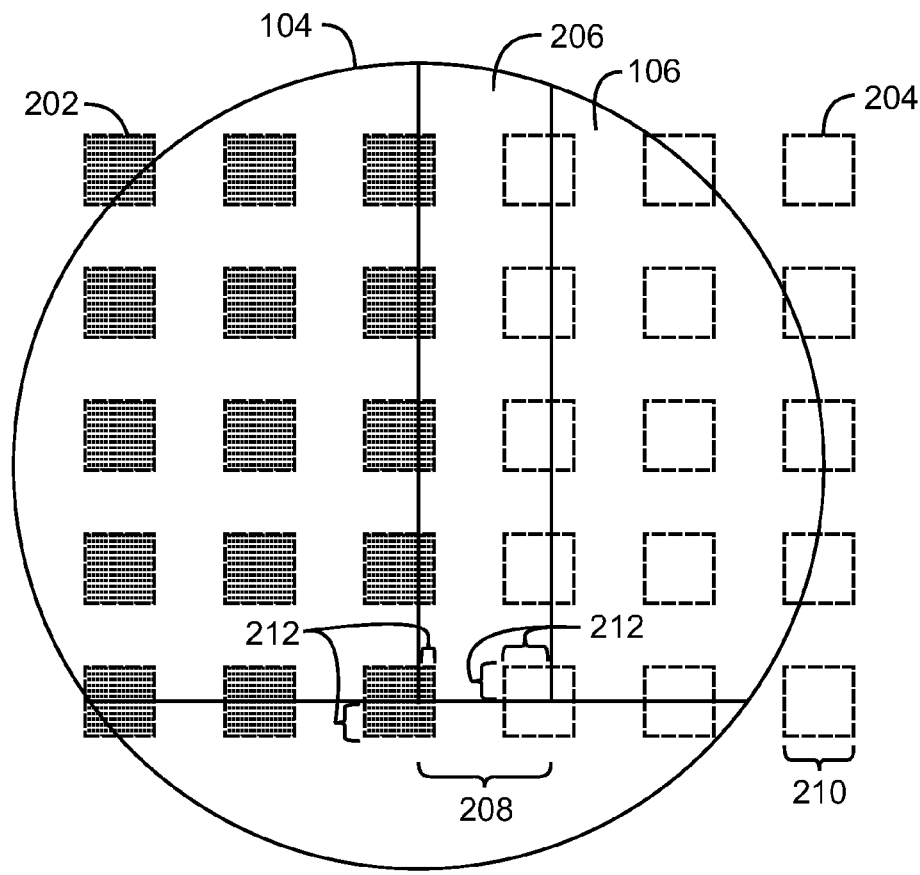
FIG. 2 is a close up view of an area of the OLED display of FIG. 1, illustrating the lighting of a number of micro-OLEDs by an energized pixel 104, in accordance with an embodiment.

FIG. 2 is a close up view 200 of an area 108 of the OLED display 100 of FIG. 1, illustrating the lighting of a number of micro-OLEDs 202 by an energized pixel 104, in accordance with an embodiment. An adjacent pixel 106 is not energized, leaving the associated micro-OLEDs 204 dark. The pixels 104 and 106 may be separated by an insulator 206. The insulator 206 has a width 208 greater than the width 210 of the micro-OLEDs 202 and 204.

Accordingly, the pixels 104 and 106, which are generally formed on an electronic backplane, do not need to be perfectly aligned with the micro-OLEDs 202 and 204, which are generally formed on a substrate, to operate correctly. This is illustrated in FIG. 2 by the offsets 212 of the micro-OLEDs 202 and 204 from the pixels 104 and 106. Any portion of a micro-OLED 202 that overlaps a pixel 104 and 106 may be fully energized by that pixel 104 and 106. Any micro-OLED 202 that does not overlap a pixel 104 and 106, for example, being fully covered by the insulator 206, will not light or otherwise interfere with the display 100. Accordingly, a pixel may energize a varied subset of the micro-OLEDs 202, and generate a display 100 without needing precise alignment between substrates, which may make the production of a flexible display structure using a lamination technique, as discussed with respect to FIG. 3, more feasible.

Figure 3:
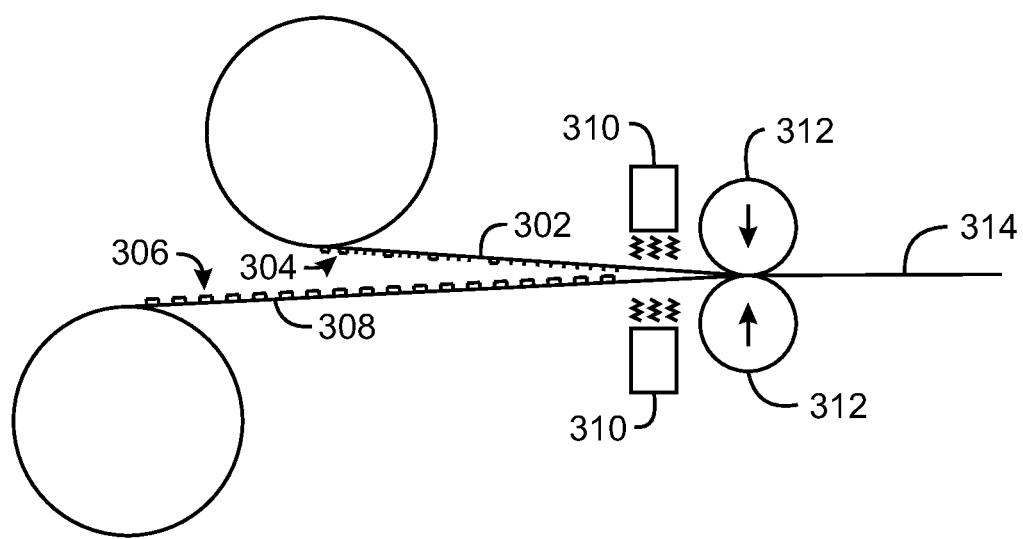
FIG. 3 is a drawing of the lamination of a substrate containing OLED structures to an electronic backplane to form an OLED display, in accordance with an embodiment.

FIG. 3 is a drawing of the lamination 300 of a substrate containing OLED structures to an electronic backplane to form an OLED display, in accordance with an embodiment. The lamination 300 may be performed by joining micro-OLED structures 304 supported on a first substrate 302 to an electronic backplane 306 on a second substrate 308. The substrates 302 and 308 are positioned so that the micro-OLED structures 304 and the electronic backplane structures 306 are facing each other prior to lamination. As noted above, the alignment between the structures 304 and 306 is not highly critical.

The substrates 302 and 308 may be heated to soften or melt a bonding layer on the micro-OLED structures 304, for example, by passing the substrates 302 and 308 through radiant heaters 310. For example, in one embodiment the radiant heaters 310 may heat the substrates 302 and 308 to greater than about 100° C. to soften the bonding layer. The heating is not limited to radiant heaters 310, but may be performed by heating rolls 312 used to provide pressure for laminating or by any number of other techniques. Further, the lamination 300 may be performed without the addition of heat. For example, a metal bonding layer on the OLED substrate 302 may be cold welded to a metal pad associated with a pixel on the electronic backplane 308. Further, the bonding layer may be a conductive adhesive that can be cured by UV light. In this case, the radiant heaters 310 may be replaced by UV lights to initiate the curing process. Depending on the type of bonding materials and bonding methods, the lamination 300 may be performed using a force in the range of about 0 MPa to 10 MPa.

The lamination 300 of the substrates 302 and 308 forms a flexible sheet 314 that may be used as a display. The method described herein involves a direct lamination process using a well-defined micro-OLED frontplane and a pixelated backplane without any additional alignment between these two pieces. Through this process, the pixel structure on the OLED display is defined by the backplane. The techniques for joining the substrates 302 and 308 are not limited to the lamination 300 procedure shown in FIG. 3. Thus, hard substrates may be used to support the OLED structures 304, the electronic backplane structures 306, or both, as described below.

Figure 4:
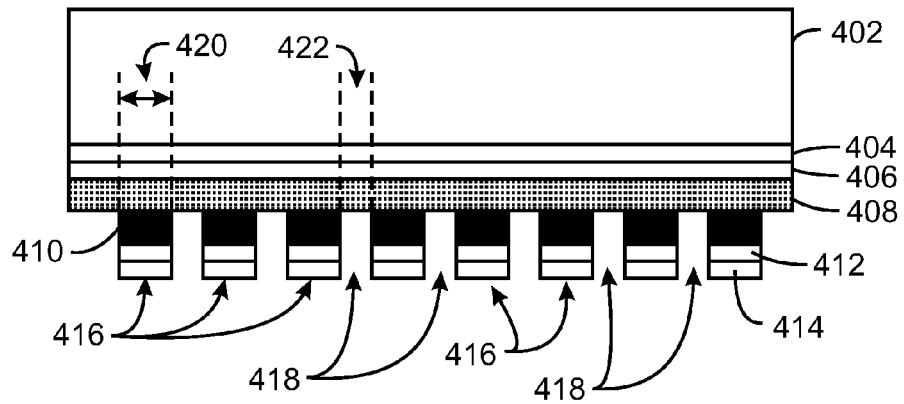
FIG. 4 is a cross section view of an OLED structure formed on a substrate, in accordance with embodiments.

FIG. 4 is a cross section view of an OLED structure 400 formed on a substrate 402, in accordance with embodiments. The substrate 402 may include any number of substantially transparent materials, both flexible and rigid. As used herein, substantially transparent includes any material that has a transmissibility of greater than about 70% at some point in the visible spectrum, e.g., at wavelengths of light in the range of about 350 nm to about 750 nm. Suitable flexible materials that may be used for the substrate 402 include polyesters, polyimides, polyacrylates, polycarbonates, silicone polymers, or any other number of polymers, organic and inorganic. The flexible materials may be processed in an extruder to form a sheet or roll of substrate 402. Suitable rigid materials that may be used for the substrate include glass, quartz, sapphire, rigid plastics, or any number of other materials. The rigid materials may be cast, or purchased from commercial source, for use as the substrate 402.

An electrode layer 404 can be formed over the substrate, for example using vacuum deposition, chemical vapor deposition, or any number of other techniques known in the art. The electrode layer 404 will generally be substantially transparent as described above. Suitable materials can include metal oxide layers, for example, indium-tin-oxide (ITO), metal layers, carbon nanotubes, graphite layers, or any number of other materials.

A hole injection layer 406 can be formed over the electrode layer 404, for example, using spin coating, blade coating, evaporation or any number of other techniques known in the art. The hole injection layer 406 can be poly(3,4-ethylenedioxythiophene) (PEDOT), poly(styrenesulfonate) (PSS), a mixture of PEDOT with PSS, or any number of other suitable materials. In some embodiments, a hole transport layer, including, for example, triphenylamine or derivatives, poly[(9,9-dioctylfluorenyl-2,7-diyl)-co-(N,N'bis(4-butylphenyl-1,1'-biphenylene-4,4'-diamine))], or any number of other polymer derivatives thereof, may be applied over the hole injection layer 406 to enhance the operation and stability of the OLED structures.

An organic light emitting layer 408 can be applied over the hole injection layer 406, for example, using blade coating, spin coating, printing, evaporation, or any number of other techniques known in the art. The OLED material 408 may be any organic small molecules, organometallic compounds, organic polymers, or combinations thereof that emit light in response to an applied voltage. Examples of materials that may be used include poly(9,9-dioctylfluorene-co-benzothiadiazole) (F8BT), polyfluorene (PFO), 2-methoxy-5-(2-ethylhexyloxy)-p-phenylenevinylene (MEH-PPV), tris(8-hydroxyquinolinato)aluminum (Alq3), tris(2-phenylpryidine) iridium(III), and many others.

Blends of various OLED materials may be used to achieve a white emitting layer. In some embodiments, a white emitting layer may be used across the entire OLED structure 400. In these embodiments, a filter may be used in another layer, for example, on the outside of the substrate 402, to achieve multiple colors. However, the OLED layer 408 is not limited to OLED material of a single color, and multiple colors may be applied over the electrode layer 404, for example, printed using an ink-jet type printer technology.

An electron injection layer 410 may be formed over the OLED layer 408, for example, by vacuum deposition or chemical vapor deposition, or any number of other techniques known in the art. The electron injection layer 410 may include any number of compounds that facilitate the injection of electrons into the OLED layer 408. For example, the electron injection layer 410 can include LiF, Ca, CsF, or any number of other metals, salts, or combinations thereof. Although shown as broken structures, the electron injection layer 410 and the following structures are initially formed as contiguous layers, and then a portion of material is removed, as discussed below.

A metal cathode 412 may be formed over the electron injection layer 410 to protect the electron injection layer 410 and to facilitate current flow. The metal cathode 412 may be formed by vacuum deposition, chemical vapor deposition, or any number of other techniques known in the art. The metal cathode 412 may include materials such as aluminum, silver, gold, or any number of other metals.

In embodiments, a bonding layer 414 may be formed over the metal cathode 412, for example, by vacuum deposition, chemical vapor deposition, blade coating, spin coating, or any number of other techniques known in the art. The bonding layer 414 is conductive, and may include any number of inorganic or organic materials. For example, the bonding layer 414 may include a low melting point metal or metal alloy. For example, the bonding layer 414 may have a melting point of 100° C., 80° C., 60° C. or lower. Such alloys can include alloys of indium with any combinations of gallium, tin, zinc, bismuth, and other metals, as well as other low melting point metals or alloys. Further, the bonding layer may include organic compounds, such as epoxies, mixed with conductive materials, such as metal flakes or particles. In embodiments, a UV curable adhesive mixture containing metal flakes or particles may also be used as the bonding layer. The electron injection layer 410, metal cathode 412, and bonding layer 414 are formed as contiguous layers across the entire surface of the OLED layer 408.

In embodiments, once these layers are formed, portions can be removed to form electrode structures 416 that are separated by empty zones 418. The electrode structures 416 energize the portion of the OLED layer 408 that is proximate to the electrode structures 416. The energized portion of the OLED layer may be termed a micro-OLED 420. The parts 422 of the OLED layer 408 that are adjacent to the empty zones 418 are not energized by any of the electrode structures 416 and, thus, can remain dark.

Removing the portions of the electron injection layer 410, metal cathode 412, and bonding layer 414 to form the empty zones 418 may be performed by subtractive patterning. Such techniques may include plasma etching, chemically reactive plasma etching, laser ablation, and cold welding, among many other techniques know in the art. For example, subtractive patterning by plasma etching or chemically reactive etching may be performed by forming a lithographic mask over the bonding layer 414. Once the lithographic mask is fixed, unexposed portions may be dissolved away, exposing portions of the bonding layer 414. The surface may then be exposed to a plasma or chemically reactive plasma, which may etch out the exposed portions of the bonding layer 414 and the underlying portions of the metal cathode 412 followed by the electron injection layer 410 to form the empty zones 418. The total etching time may be controlled by the sensitivity of the OLED layer 408 to damage from the etchant, as undercutting the electrode structures 416 may result in a less functional structure. In embodiments, the resulting electrode structures 416 may be sized to create micro-OLEDs of about 1 µm, 5 µm, 10 µm, 20 µm, 50 µm, 100 µm, or larger in width.

As mentioned, subtractive patterning may also be performed by cold welding. In this technique, a patterned metal surface may be pressed against the bonding layer 414. Under high pressure, the patterned metal surface welds to the bonding layer and may cut at the edges of the patterns on the patterned metal surface. Removal of the patterned metal surface may also remove portions of the bonding layer 414 and the attached electron injection layer 410 and metal cathode 412. This can form the empty zones 418 as a negative image of the patterned metal surface. The bonding layer 414 of the electrode structures 416 can be used to bond the electrode structures 416 to metal pads associated with the pixels of the electronic backplane.

As mentioned, subtractive patterning may also be performed by laser ablation. In this technique, portions of the bonding layer 414 may be exposed to a suitable laser and removed. Removal of portions of the bonding layer 414 leads to a laser expose to metal cathode 412 followed by the electron injection layer 410 so as to form the empty zones 418.

Figure 5:
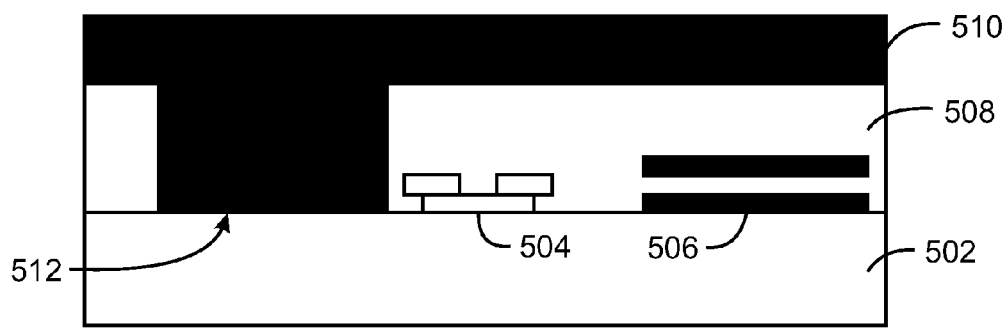
FIG. 5 is a cross section of a pixel in an electronic backplane, in accordance with an embodiment.

FIG. 5 is a cross section of a pixel 500 in an electronic backplane, in accordance with an embodiment. The electronic backplane may be formed using any number of fabrication techniques known in the art, including, for example, any combinations of chemical vapor deposition, lithography, plasma etching, and reactive etching, among others. The pixel 500 is formed on a substrate 502, which may be selected from any of the materials discussed with respect to the substrate 402 for the OLED structure 400. The two substrates 402 and 502 do not have to be formed from the same materials, but may be formed from different materials.

In the pixel 500, a thin film transistor (TFT) 504 may be formed over the substrate 502, along with a holding capacitor 506. Both the TFT 504 and holding capacitor 506 may be covered by an insulating layer 508. The materials used to form the electronic components of the pixel 500, may include any combinations of silicon, gallium/arsenide, or any other semiconducting materials. As will be recognized, the semiconducting materials can be appropriately doped to form n or p channels of the transistor, for example, by ion implantation or other techniques know in the art. The insulating layer 508 may be an undoped semiconducting material, such as silicon, and the like, or may be any number of other materials used for this function in the electronic arts, including, for example, silicon carbide, silicon nitride, polyimide, or other organic or inorganic materials.

A pixel pad 510 may be coupled to the TFT 504 through a via 512 extending through the insulating material 508. The pixel pad 510 can carry the current used to energize an OLED structure 400 (FIG. 4). The pixel pad 510 may be formed by the same fabrication techniques as the TFT 504 or the holding capacitor 506 or by any number of other techniques know in the art. The pixel pad 504 may be made from tin, silver, aluminum, indium, or any number of alloys, including any of the alloys discussed with respect to the bonding layer 414 of FIG. 4. In some embodiments, the pixel pads 510 may be about 50 µm to 1 mm in width. In other embodiments, the pixel pads 510 may be interconnected or may be larger in size to create a segmented display. In comparison to the boding layer 414, the pixel pad 510 may have a higher melting point to prevent short circuits from forming. For example, the pixel pad 510 may have a melting point of 110° C., 130° C., 150° C., or higher.

The pixel pad 510 is not limited to metals, as other structures may be used. For example, the pixel pad 510 may be formed from an epoxy or other polymers containing embedded conductive materials. In this embodiment, the pixel pad 510 may be formed by knife coating, printing, or ink-jetting, followed by curing. The pixels 500 of the electronic backplane structure may be laminated to the OLED structures 400 discussed with respect to FIG. 4 to form a display, as discussed with respect to FIG. 6.

Figure 6:
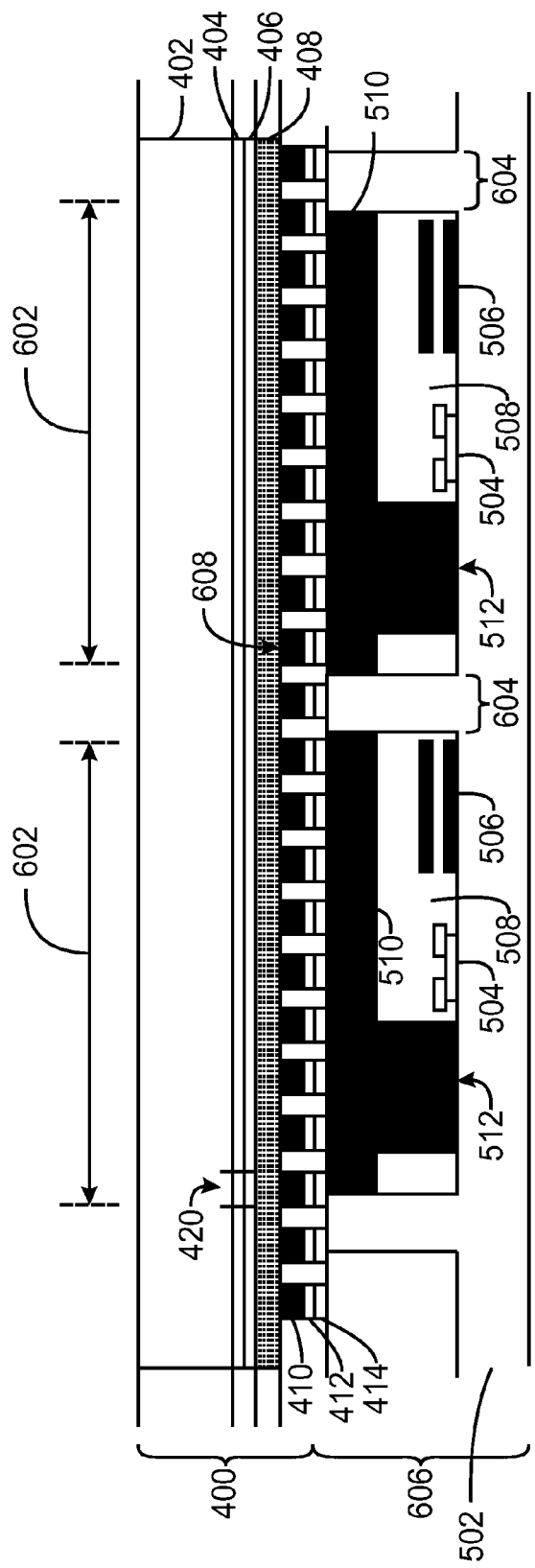
FIG. 6 is a cross sectional view of a laminated display, in accordance with embodiments.

FIG. 6 is a cross sectional view of a laminated display 600, in accordance with embodiments. In FIG. 6, like structures are as described with respect to FIGS. 4 and 5. The laminated display 600 has a number of pixels 602 defined by the area of each of the pixel pads 510. Each of the pixel pads 510 are insulated from other pixel pads 510 by an insulating region 604. The insulating region may be a portion of the substrate 502 of the electronic backplane 606 that extends up between cells, for example, if the substrate 502 was formed with recessed regions to hold the pixel electronics. In other embodiments, the insulating regions 604 may be formed at the same time as the electronics, for example, using the same fabrication techniques. As noted previously, any OLED structure, such as structure 608, that overlies an insulating region 604 is not active in the final display. Accordingly, perfect alignment between the electronic backplane 606 and the OLED structures 400 is not needed. Imperfections in the alignment will merely result in energization of a slightly different set of micro-OLEDs 420, essentially resulting in a self alignment during the lamination. The edges of the laminated structure may be sealed, for example, with an applied edge cap, to prevent damage to the unit from infiltration of oxygen or moisture.

Figure 7:
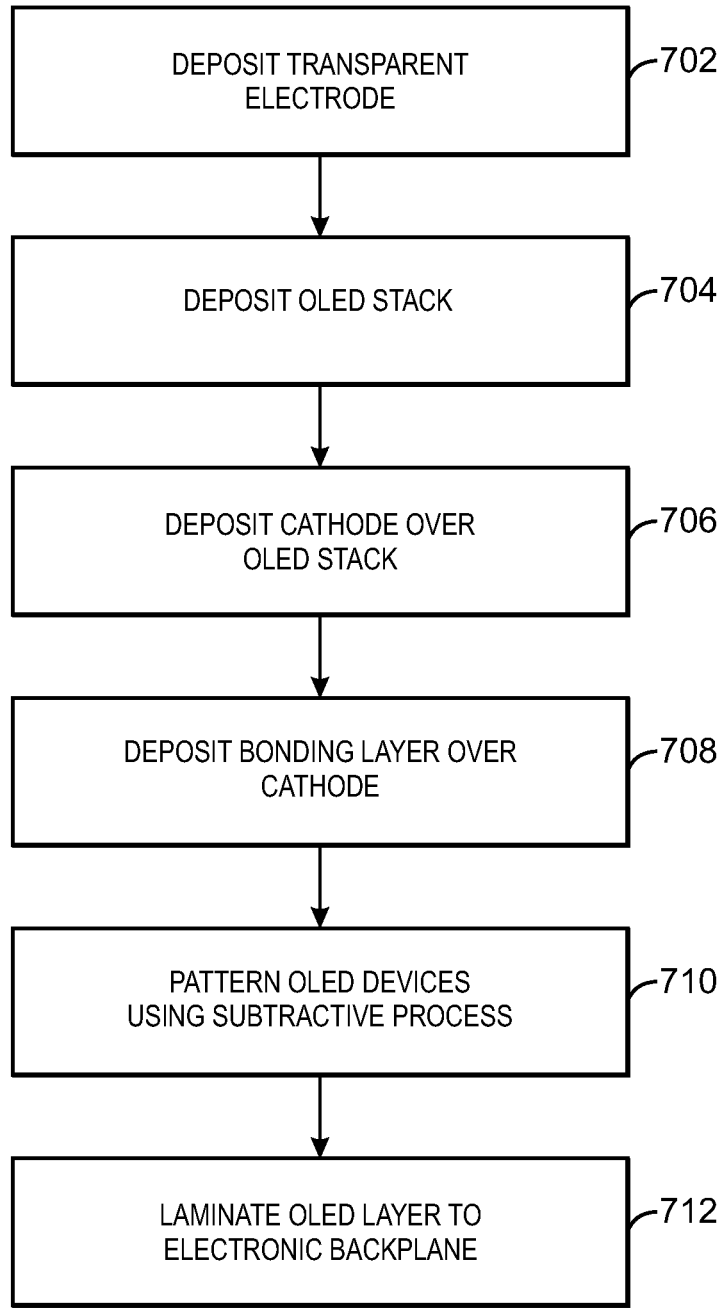
FIG. 7 is a block diagram of a method for forming OLED structures, in accordance with embodiments.

FIG. 7 is a block diagram of a method 700 for forming OLED structures, in accordance with embodiments. The method 700 begins at block 702 with the formation of a substantially transparent electrode over a substrate, for example, as discussed with respect to FIG. 4. At block 704, an OLED stack may be deposited over the substantially transparent electrode. The OLED stack generally includes a number of layers, including a hole injection layer (if present), a hole transport layer (if present), an organic emitting material layer, and an electron injection layer. At block 706, a metal cathode can be deposited over the OLED stack, for example, over the electron injection layer 410. At block 708, a bonding layer may be deposited over the metal cathode. At block 710, the micro-OLED devices may be created by patterning the electrode injection layer, the metal cathode, and the bonding layer using a subtractive process, as described with respect to FIG. 4. At block 712, the micro-OLED structures may be laminated to an electronic backplane, described with respect to FIG. 5, to create a display structure, for example, as described with respect to FIG. 3. The display structure may be used in any number of electronic devices, as discussed with respect to FIG. 8.

Figure 8:
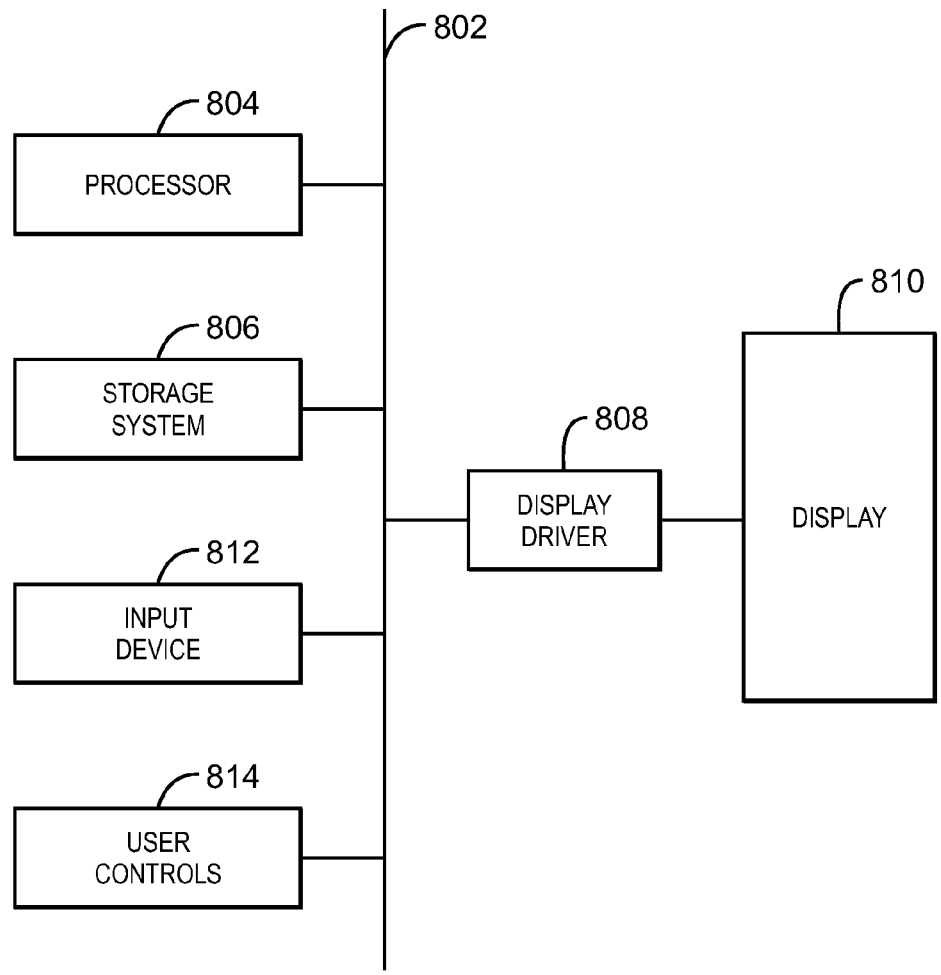
FIG. 8 is a block diagram of an electronic device that uses a micro-OLED display structure, in accordance with embodiments.

FIG. 8 is a block diagram of an electronic device 800 that uses a micro-OLED display structure, in accordance with embodiments. The electronic device 800 may have a bus 802. A processor 804 may access a storage system 806 to obtain code configured to direct the processor 802 to obtain data over the bus 802 and provide the data to a display driver 808 for rendering on an OLED display 810. The storage system 806 may include any combination of read only memory (ROM), random access memory (RAM), hard drives, optical drives, RAM drives, or flash drives. The data may also be provided to the processor by an input system 812, for example, coupled to a cable network, a satellite uplink, a home network, a local area network, a wide area network, the Internet, or any combinations thereof. The electronic device 800 may be controlled using user controls 814, which may include, for example, a keyboard, a mouse, a remote control, buttons on the unit, or any combinations thereof. The electronic device 800 may include a television, a monitor, an all-in-one computer, a personal information device, a mobile phone, a large display screens (such as a stadium display), a sign, and the like.

What is claimed is:

1. A method of forming a display, comprising:
   forming a first electrode layer on a first substrate;
   forming an organic light emitting diode (OLED) stack on the first electrode layer;
   forming a second electrode layer over the OLED stack;
   forming a bonding layer over the second electrode layer, wherein the bonding layer comprises a conductive material;
   patterning the bonding layer and the second electrode layer to form a plurality of micro-OLEDs, wherein the patterning is performed by removing a portion of the bonding layer and the second electrode layer; and
   joining the plurality of micro-OLEDs on the first substrate to a plurality of pixels in an electronic backplane on a second substrate, wherein any one pixel in the electronic backplane can couple to a varied subset of micro-OLEDs in the plurality of micro-OLEDs.

2. The method of claim 1, wherein forming OLED stack comprises:
   depositing a hole transport layer;
   depositing an organic light emitting material layer; and
   depositing an electron injection layer.

3. The method of claim 1, wherein forming the second electrode layer over the OLED stack comprises vapor deposition of a metal layer over the OLED stack.

4. The method of claim 1, wherein forming the bonding layer comprises depositing a low melting point metal over the second electrode layer.

5. The method of claim 1, wherein the portion of the bonding layer and the second electrode layer are removed by laser ablation.

6. The method of claim 1, wherein the portion of the bonding layer and the second electrode layer are removed by a method comprising:
   cold-welding the portion of the bonding layer and the second electrode layer to a patterned die; and
   removing the cold-welded portion from the surface of the OLED stack.

7. The method of claim 1, comprising forming the electronic backplane on the second substrate by forming an active display matrix of thin film transistors on the second substrate.

8. The method of claim 1, wherein joining comprises:
   applying heat to melt the bonding layer; and
   applying pressure to join the OLED structure on the first substrate to an active side of an electronic backplane on the second substrate.

9. The method of claim 1, wherein joining the plurality of micro-OLEDs on the first substrate to the plurality of pixels in the electronic backplane comprises applying pressure to cold-weld the bonding layer to a plurality of electrodes on an active side of the electronic backplane on the second substrate.

10. A display, comprising:
    an organic light emitting diode (OLED) structure formed on a first substrate, comprising:
      a substantially transparent conducting electrode;
      an OLED stack;
      a second electrode;
      a bonding layer, wherein the second electrode and the bonding layer are patterned together by removal of a portion of the second electrode and a portion of the bonding layer to form a plurality of micro-OLED structures; and
    an electronic backplane structure comprising a plurality of pixels formed on a second substrate, wherein the plurality of pixels is joined to the plurality of micro-OLEDs by the bonding layer, and wherein any one pixel in the electronic backplane structure can couple to a varied subset of micro-OLEDs in the plurality of micro-OLEDs.

11. The display of claim 10, wherein the OLED stack comprises:
    a hole injection layer;
    an organic material configured to emit light in response to an electric current; and
    an electron injection layer.

12. The display of claim 10, wherein a pixel in the plurality of pixels comprises a metal pad that is insulated from neighboring pixels.

13. The display of claim 10, wherein the plurality of micro-OLEDs are formed by the patterning of the second electrode and the bonding layer by laser ablation, reactive etching, cold welding, or any combinations thereof.

14. The display of claim 10, wherein if the micro-OLED overlaps a pixel in the electronic backplane structure it is configured to be energized by the pixel.

15. The display of claim 10, wherein the bonding layer comprises a low-melting point metal alloy.

16. An electronic device comprising:
    a micro-OLED display, comprising:
      an organic light emitting diode (OLED) structure formed on a first substrate, comprising:
        a substantially transparent conducting electrode;
        an OLED stack;
        a second electrode;
        a bonding layer, wherein the second electrode and the bonding layer are patterned together by the removal of a portion of the second electrode and a portion of the bonding layer to form a plurality of micro-OLEDs; and
      an electronic backplane structure formed on a second substrate, comprising a plurality of pixels on an active side, wherein the plurality of pixels is joined to the plurality of micro-OLEDs by the bonding layer, and wherein any one pixel in the electronic backplane structure can couple to a varied subset of micro-OLEDs in the plurality of micro-OLEDs;

a display driver configured to display data on the micro-OLED display; and a processor configured to provide data to the display driver.

17. The electronic device of claim 16, comprising a storage unit comprising code configured to direct the processor to obtain the data and provide the data to the display driver.

18. The electronic device of claim 16, comprising an input system to obtain data for display, wherein the input system is configured to be coupled to a cable network, a satellite uplink, a home network, a local area network, a wide area network, an Internet connection, or any combinations thereof.

19. The electronic device of claim 16, comprising a keyboard, a mouse, a remote control, buttons on the unit, or any combinations thereof.

20. The electronic device of claim 16, comprising a television, a monitor, an all-in-one computer, a personal information device, a mobile phone, a large display screen, or a sign.

* * * * *